(12) United States Patent
Newell et al.

(10) Patent No.: US 7,228,511 B1
(45) Date of Patent: Jun. 5, 2007

(54) METHOD AND APPARATUS FOR DESIGNING PRINTED CIRCUIT BOARDS TO MEET LEAKAGE CURRENT REQUIREMENTS

(75) Inventors: Larry Dale Newell, Golden, CO (US); David A. Norte, Westminster, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 246 days.

(21) Appl. No.: 11/094,458

(22) Filed: Mar. 30, 2005

(51) Int. Cl.
*G06F 17/50* (2006.01)

(52) U.S. Cl. .................... 716/2; 716/4; 716/19; 703/14

(58) Field of Classification Search .................... 716/1, 716/2, 4, 6, 19; 703/14
See application file for complete search history.

(56) References Cited

U.S. PATENT DOCUMENTS

2005/0221128 A1* 10/2005 Kochergin .................. 428/824

* cited by examiner

*Primary Examiner*—Thuan Do
(74) *Attorney, Agent, or Firm*—John C. Moran

(57) ABSTRACT

A method and apparatus used for designing printed circuit boards to meet current leakage requirement by determining an approximate model of electric fields based on a structure between two conductors on an outer surface of a printed circuit board; deriving an effective permittivity of the model of the electric fields; calculating a plurality of electric fields using the derived effective permittivity by varying a distance between the two conductors, a thickness of the printed circuit board, and an applied voltage between the two conductors; plotting a graph of the calculated plurality of electric fields; and selecting by using the graph a configuration of the two conductors so as to meet the current leakage requirement. A printed circuit board has a set of conductors on the outer surfaces of the printed circuit board; another set of conductors interior to the printed circuit board; and a solder mask that covers only the set of conductors on the outer surfaces of the printed circuit board.

8 Claims, 9 Drawing Sheets

METHOD AND APPARATUS FOR DESIGNING PRINTED CIRCUIT BOARDS TO MEET LEAKAGE CURRENT REQUIREMENTS

TECHNICAL FIELD

This invention relates to the design of printed circuit boards.

BACKGROUND OF THE INVENTION

Printed circuit boards utilized in certain applications such as those printed circuit boards utilized in telecommunication public facilities must demonstrate the ability of conductors exposed on the surface of the printed circuit board to withstand a high-voltage surge without causing safety compromises to the end user. Regulatory compliance tests have been set up to test for such conditions. One such regulatory test is defined by the TIA968A Leakage Current Limitations test as outlined in section 4.3 of the standard. The latter test specifically requires that exposed printed circuit board conductors must not cause their dielectric insulation to break down under the response to a 1500 Vrms low-frequency sine wave of a 60 seconds duration. If the dielectric breakdown occurs between the exposed printed circuit conductors and the leakage current exceeds 10 ma, the printed circuit board fails this particular test and must be redesigned so that the exposed conductors can be in compliance with this test.

Within the prior art, the redesign of the printed circuit board has been accomplished either by simply increasing the distance between the edges of the two exposed conductors such that the dielectric breakdown is avoided between the conductors. A second approach has been to use conformal coatings between the two conductors. Although both of these prior art approaches are effective, it is very costly to have to either redesign for a larger distance between the conductors or to use conformal coatings.

SUMMARY OF THE INVENTION

A method and apparatus used for designing printed circuit boards to meet current leakage requirement by determining an approximate model of electric fields based on a structure between two conductors on an outer surface of a printed circuit board; deriving an effective permittivity of the model of the electric fields; calculating a plurality of electric fields using the derived effective permittivity by varying a distance between the two conductors, a thickness of the printed circuit board, and an applied voltage between the two conductors; plotting a graph of the calculated plurality of electric fields; and selecting by using the graph a configuration of the two conductors so as to meet the current leakage requirement.

A printed circuit board has a set of conductors on the outer surfaces of the printed circuit board; another set of conductors interior to the printed circuit board; and a solder mask that covers only the set of conductors on the outer surfaces of the printed circuit board.

DETAILED DESCRIPTION

Figure 1:
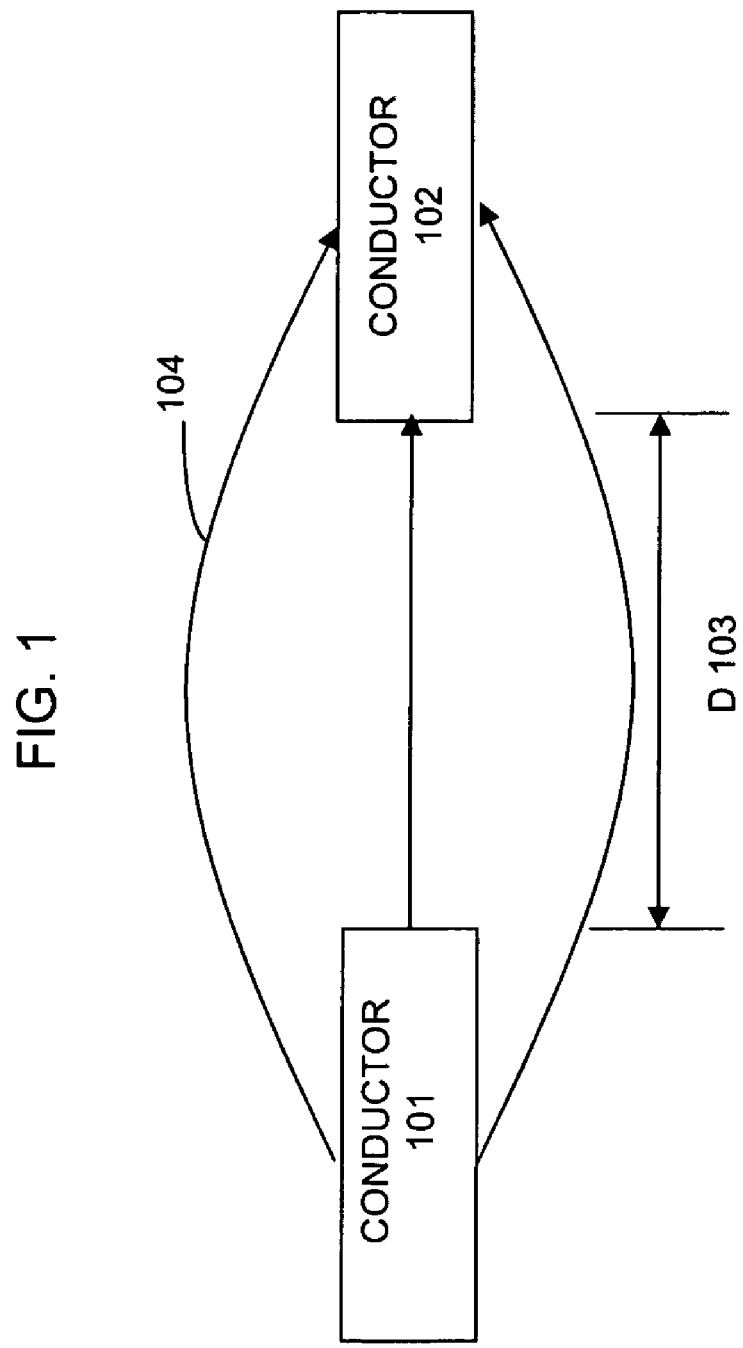
FIG. 1 illustrates an embodiment in which two conductors are suspended in air.

FIG. 1 illustrates an embodiment in which conductors 101 and 102 are suspended in air separated by a distance, D103. The lines denoted by 104 illustrate the electric field in air between conductors 101 and 102 which is defined by the following Equation:

$$E_0 = C_{eff} * V * \Delta l * A * R / (4 * \pi * \epsilon_0 * d^2) \qquad \text{Equation 1}$$

where

V=peak test voltage

A=(standard atm. pressure)/(test atm. pressure)

R=(standard relative humidity)/(test relative humidity)

$\epsilon_0$=absolute permittivity of air, which equals 8.85(10–12) Farads/meter d=D 103 of FIG. 1

$C_{eff}$=distributed capacitance between the two conductors $\Delta l$=differential length of conductor The dielectric breakdown electric field in air is approximately 78 volts/mil (at 5280 feet of elevation), in which one mil is equal to one-thousandth of an inch. Once $E_o$ reaches this value at a given distance, d, displacement current will flow between the two conductors. Once this distance is reduced to the point in which this leakage current reaches 10 ma, the circuit will fail the 1500 Vrms regulatory leakage current test.

Figure 2:
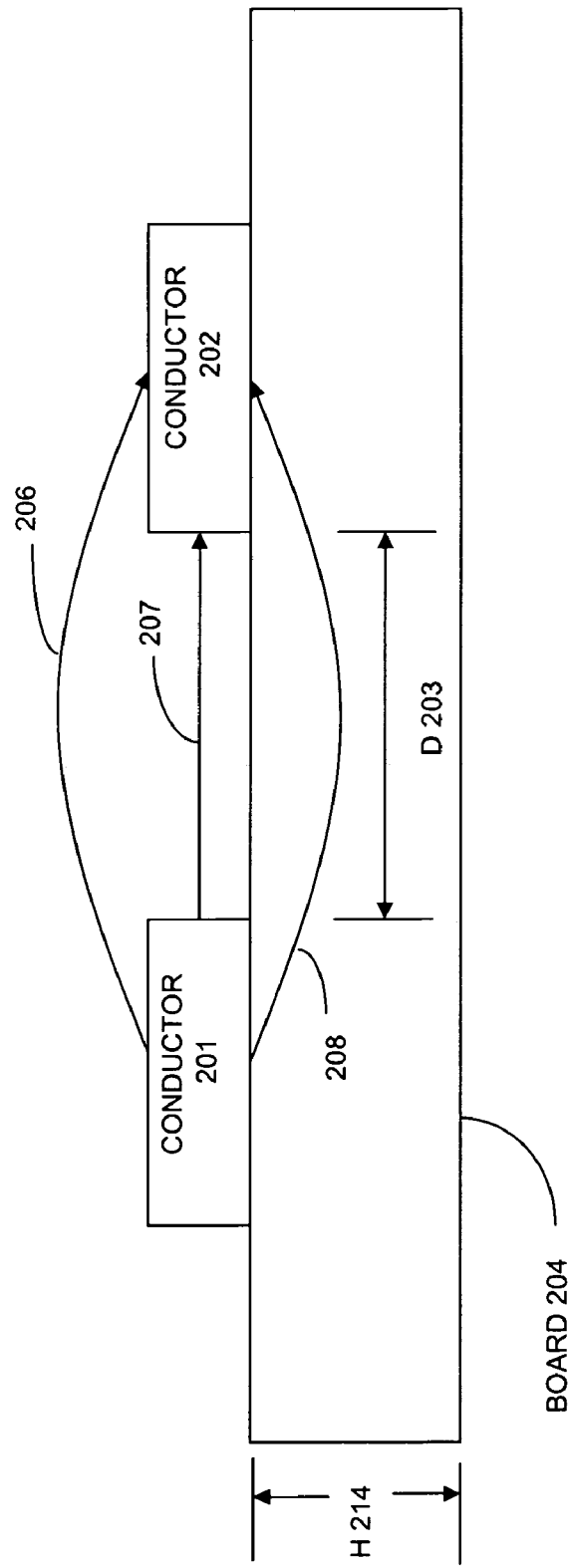
FIG. 2 illustrates an embodiment in which two conductors are mounted on an outside surface of a printed circuit board.

FIG. 2 illustrates an embodiment, where conductors 201 and 202 are positioned on top of printed circuit board 204. The thickness of board 204 is denoted by H214. The distance between conductors 201 and 202 is denoted by D203. The electric field in air between conductors 201 and 202 is designated as 206 and 207. The electric field through board 204 is designated as 208. The electric fields within this structure are illustrated in FIG. 2 can be determined by the following equation:

$$E_m = C_{eff} * V * \Delta l * A * R / (4 * \pi * \epsilon_m * \epsilon_0 * d^2) \qquad \text{Equation 2}$$

where

V=peak test voltage

A=(standard atm. pressure)/(test atm. pressure)

R=(standard relative humidity)/(test relative humidity)

$\epsilon_0$=absolute permittivity of air, which equals 8.85(10–12) Farads/meter d=D 203 of FIG. 2

$\epsilon_m$=relative permittivity of either air or the printed circuit board dielectric material $C_{eff}$=distributed capacitance between the two conductors $\Delta l$=differential length of conductor For example, the electric field in air within this structure would be determined by setting $\epsilon_m$ equal to 1.0. The electric field within the printed circuit board material of this structure would be determined by setting $\epsilon_m$ equal to the relative permittivity of this material. For FR4 material, $\epsilon_m$ would be equal to 4.0, for example. It should also be noted that the breakdown electric field for FR4 material is approximately 905 volts/mil (at 5280 feet of elevation), which is significantly larger than that due to air (78 volts/mil) alone.

Figure 3:
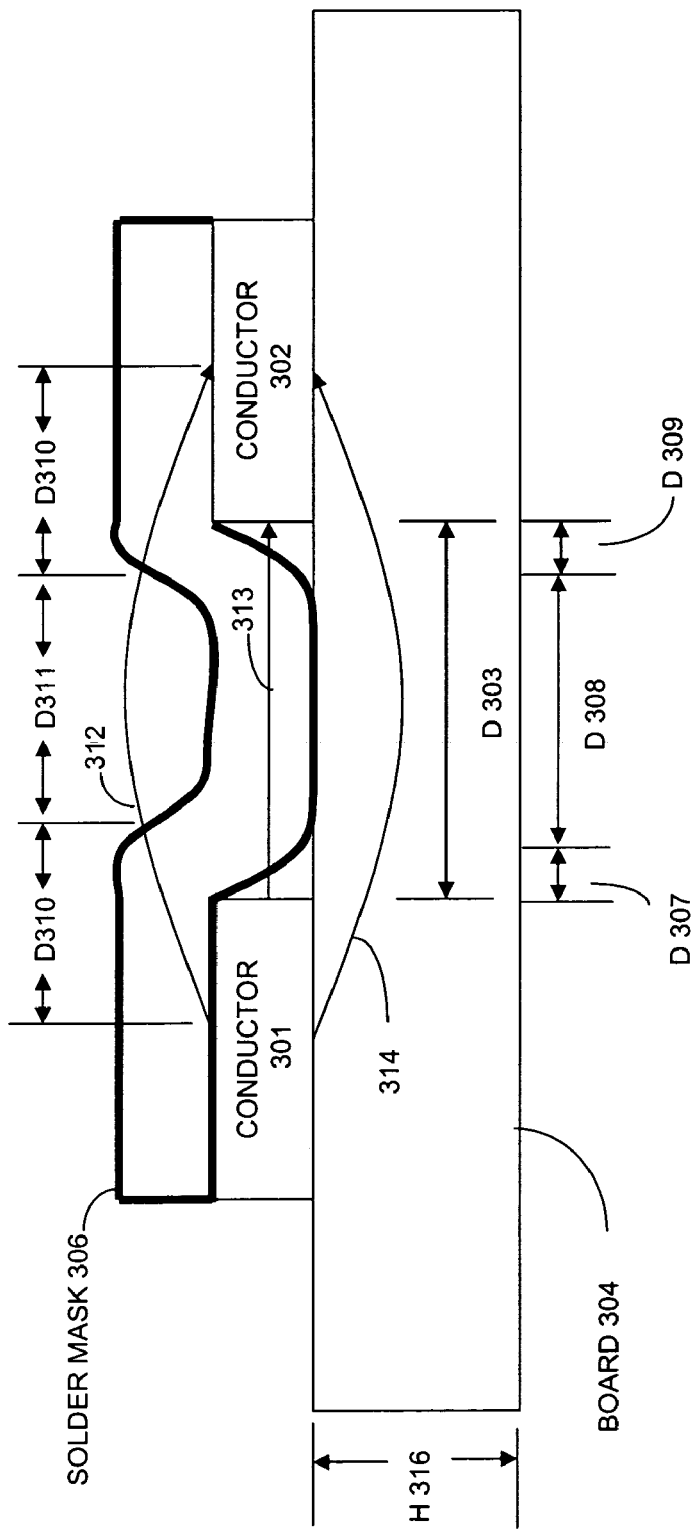
FIG. 3 illustrates an embodiment in which two conductors are mounted on an outside surface of a printed circuit board with a solder mask covering the conductors and the space between the conductors.

The effective permittivity, $\epsilon_{\mathit{eff}}$, which is embedded in the value of $C_{\mathit{eff}}$, approximates the combined effects of the permittivity of air and the board 204 on the electric field between conductors 202 and 201. Note that $C_{\mathit{eff}}$ also reflects the effective permittivity between conductors 201 and 202. The effective permittivity for the structure shown in FIG. 2 is given by the following equation:

$$\epsilon_{\mathit{eff}} = (1/3)^*(\epsilon_1\epsilon_0 + 2\epsilon_0) \qquad \text{Equation 3}$$

where:

$\epsilon_1$=relative permittivity of the printed circuit board dielectric material FIG. 3 illustrates an embodiment in which conductors 301 and 302 are mounted on top of printed circuit board 304. Conductors 301 and 302 are separated by distance, D303. A solder mask 306 covers conductors 301 and 302 and most of the gap between conductors 301 and 302. The portion of the gap covered by solder mask 306 is given by distance D308. The portion of the gap that is not covered by solder mask 306 is defined by D307 and D309. The thickness of the printed circuit board 304 is defined by H316. There are 3 electric fields illustrated in FIG. 3: indirect electric field path 312, direct electric field path 313, and indirect electric field board path 314. The effective permittivity for this structure may be denoted as in Equation 4.

$$\epsilon_{\mathit{eff}} = (1/3)^*\{\epsilon_1\epsilon_0([2b/(2b+a)]\epsilon_0 + [a/(2b+a)]\epsilon_2\epsilon_0)\} + 1/3^* \\ [(d/[2c+d])\epsilon_0 + (2c/[2c+d])\epsilon_2\epsilon_0] \qquad \text{Equation 4}$$

where:

$\epsilon_1$=relative permittivity of the printed circuit board material $\epsilon_2$=relative permittivity of the solder mask material a=a solder mask portion of a direct electric field path, D 308 of FIG. 3 b=an air void segment of the direct electric field path, D 307 or D 309 of FIG. 3 c=a solder mask segment of an indirect electric field path, D 310 of FIG. 3 d=an air portion of the indirect electric field path, D 311 of FIG. 3

Although solder mask 306 is illustrated as being only on top of and between conductors 301 and 302, the solder mask 306 would be applied over the entire board. This widespread application of solder mask 306 causes pits and voids within solder mask 306. For example, the voids are denoted by distances D307 and D309, as well as the depression of the solder mask material between these two conductors. Further, pits in the solder mask 306 over a conductor such as conductor 301 can result in oxidation effects on the conductor.

Figure 4:
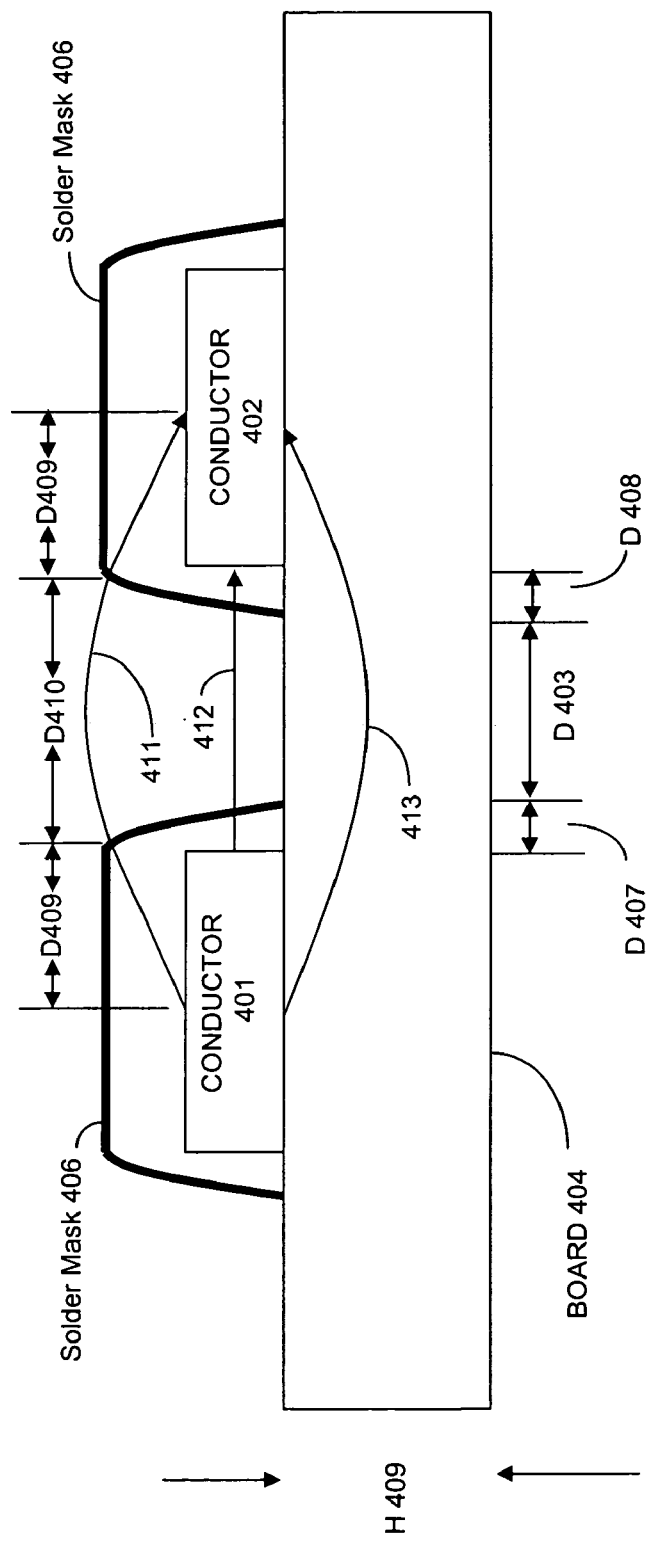
FIG. 4 illustrates an embodiment in which two conductors are mounted on an outside surface of a printed circuit board with only the conductors being coated by a solder mask.

FIG. 4 illustrates an embodiment where only conductors 401 and 402 are covered by solder mask 406. This limited application of solder mask 406 avoids the problems of voids and pits that occur in the solder mask as mentioned with respect to FIG. 3. There are 3 electric fields illustrated in FIG. 4: indirect electric field path 411, direct electric field path 412, and indirect electric field board path 413. The effective permittivity of the structure illustrated in FIG. 4 is given by Equation 5.

$$\epsilon_{\mathit{eff}} = (1/3)^*(\epsilon_1\epsilon_0(2c/[2c+d]\epsilon_2\epsilon_0 + d/[2c+d]\epsilon_0) + \\ [2b/(2b+a)]\epsilon_2\epsilon_0 + [a/(2b+a)]\epsilon_0) \qquad \text{Equation 5}$$

where:

$\epsilon_1$=relative permittivity of the print circuit board material $\epsilon_2$=relative permittivity of the solder mask material a=an air portion of a direct electric field path, D 403 of FIG. 4 b=a solder mask segment of the direct electric field path, D 407 or D 408 of FIG. 4 c=a solder mask segment of an indirect electric field path, D 409 of FIG. 4 d=an air portion of the indirect electric field path, D 410 of FIG. 4

Figure 5:
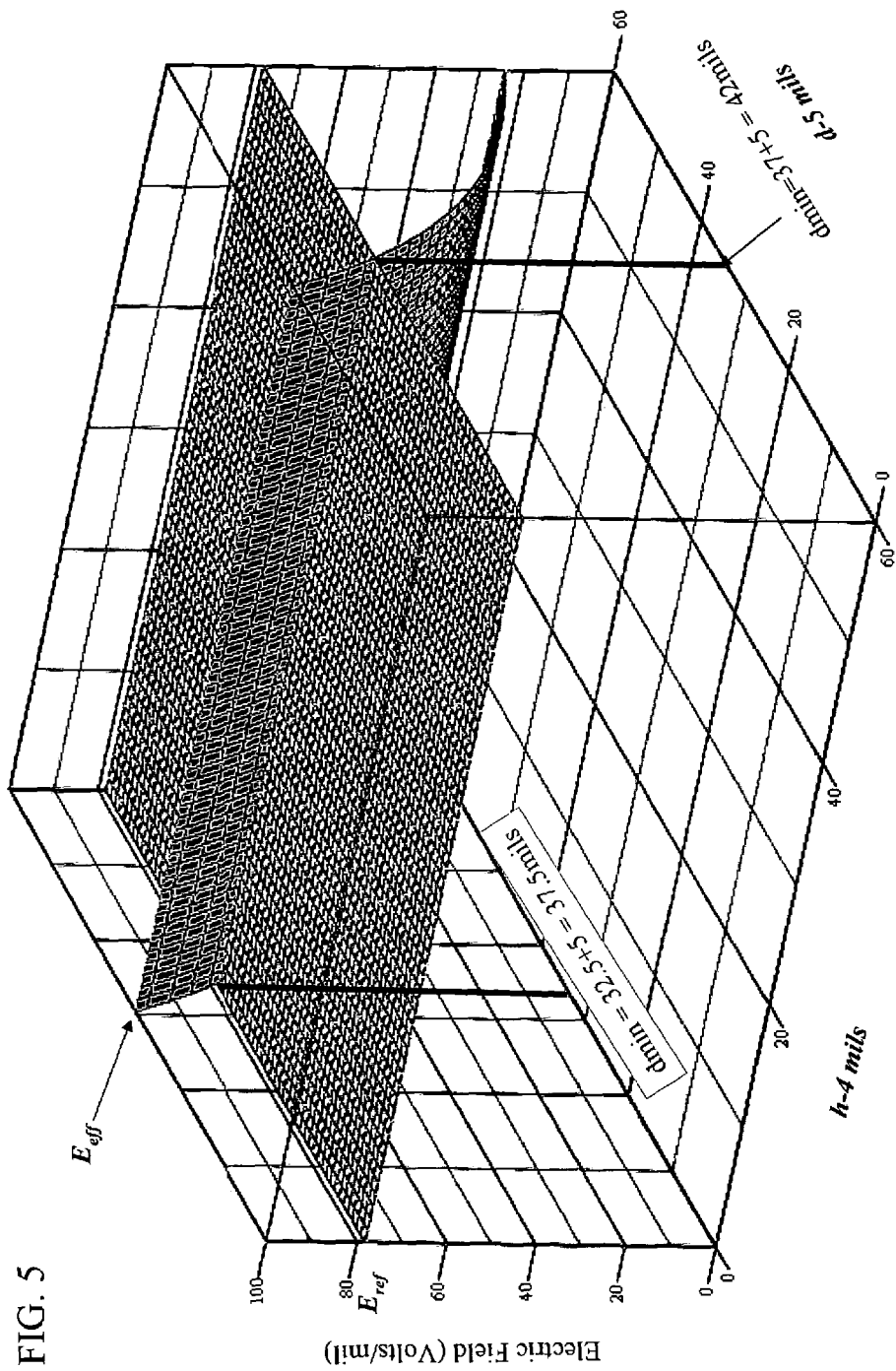
FIG. 5 illustrates, in graphical form, the characteristics of a structure such as illustrated in FIG. 2.
Figure 6:
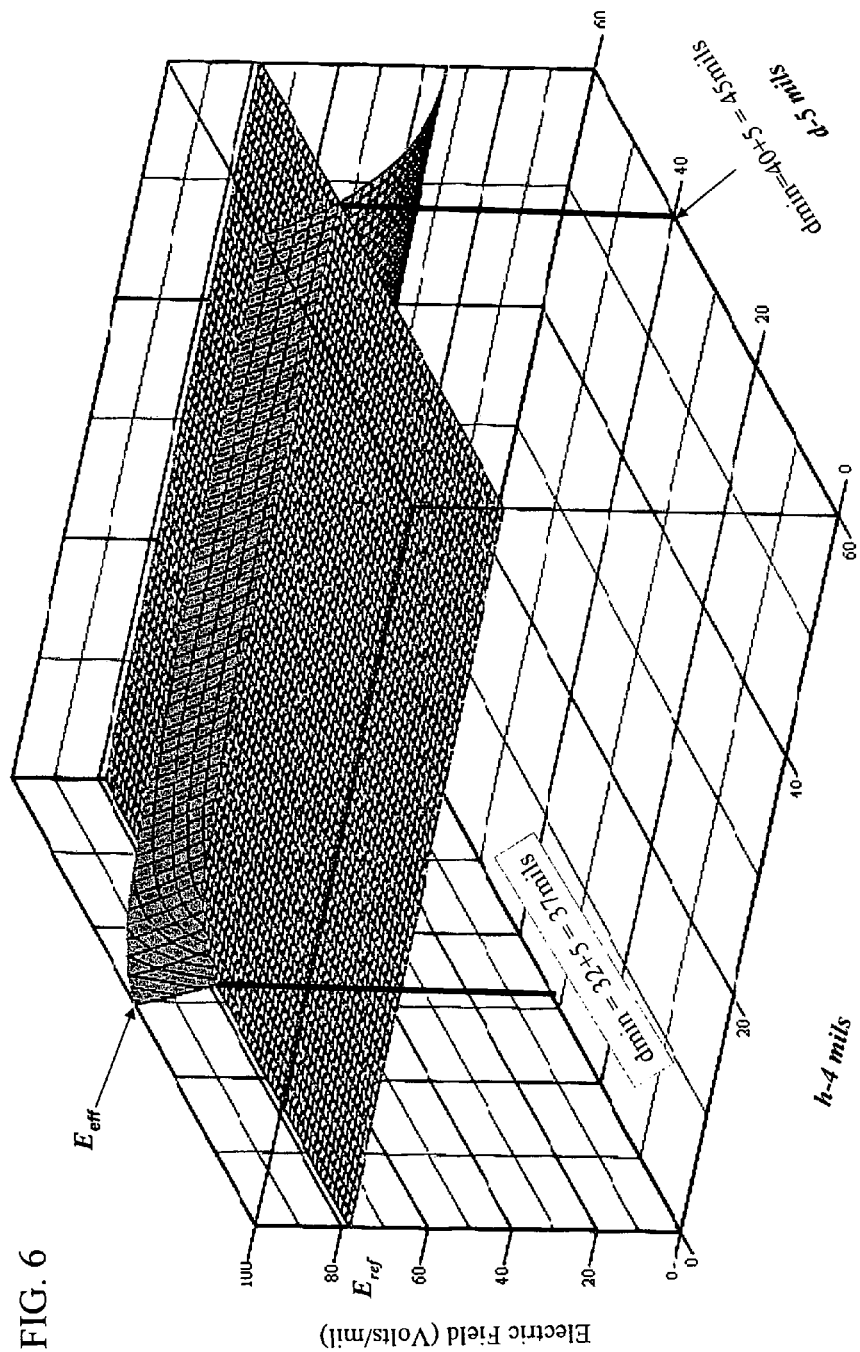
FIG. 6 illustrates, in graphical form, characteristics of the structure illustrated in FIG. 3.
Figure 7:
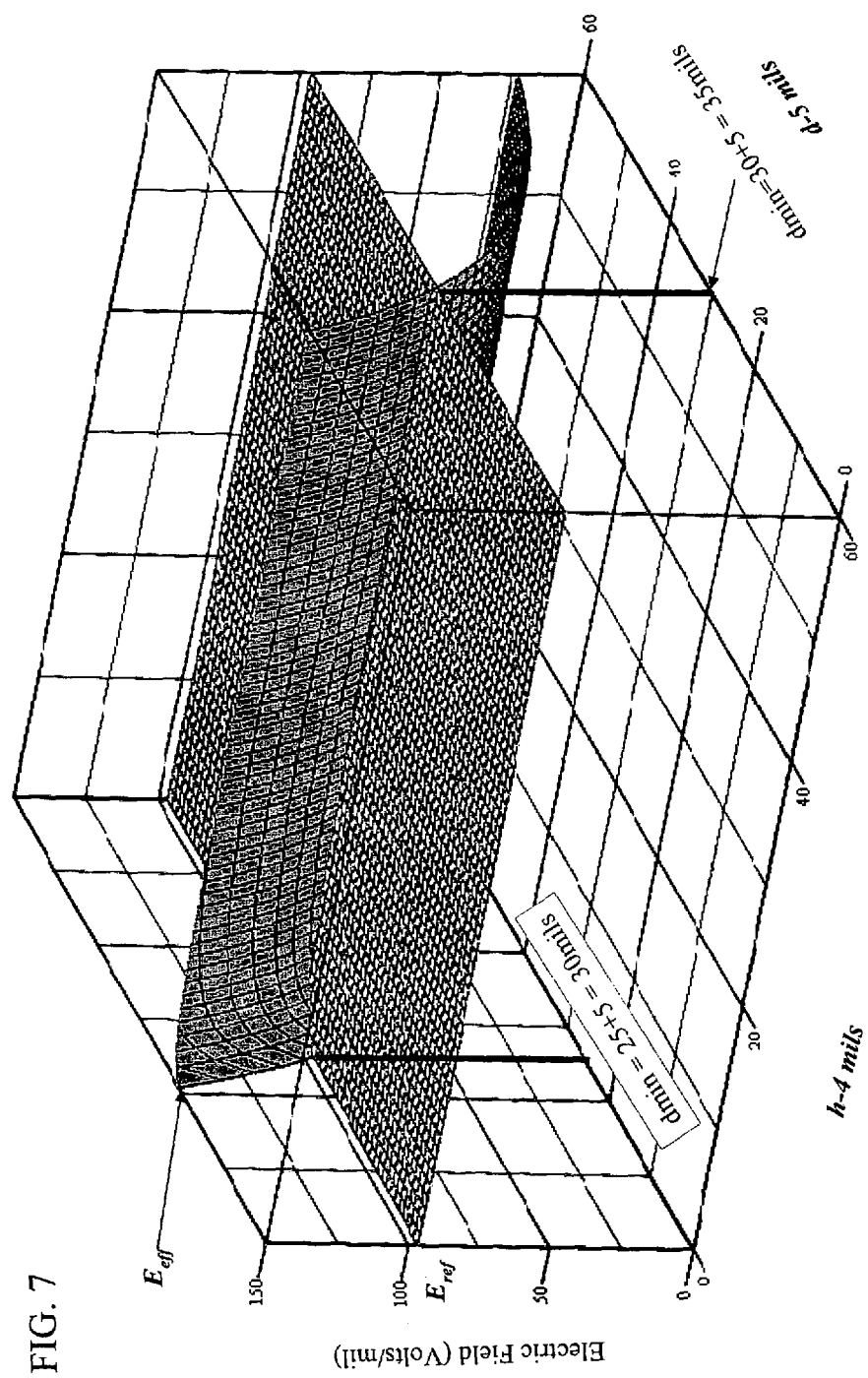
FIG. 7 illustrates, in graphic form, characteristics of the structure illustrated in FIG. 4.

By using Equation 2 with $\epsilon_m$=1.0 and the appropriate values of $C_{\mathit{eff}}$ and $\epsilon_{\mathit{eff}}$ for each of the structures shown in FIGS. 2–4, a surface plot of the electric fields in air can be determined for each structure. Since air is characterized with the smallest breakdown electric field (78 volts/mil at 5280 feet of elevation) that will cause a test failure, FIGS. 5, 6, and 7 illustrate simulation results of the electric fields, in air ($\epsilon_m$=1.0), for the structures illustrated in FIGS. 2, 3, and 4, respectively, at a relative humidity of 13%, an atmospheric pressure of 12.1 psi, Equation 3 was used for the effective permittivity in FIG. 5, whereas Equations 4 and 5 were used for the effective permittivities in FIGS. 6 and 7, respectively. These effective permittivities were in turn used to calculate $C_{\mathit{eff}}$ for each of the three structures. In FIGS. 5–7, $E_m$ is the electric field in air. The $E_{\mathit{ref}}$ value is the reference breakdown electric field of air and represents the maximum allowable electric field (78 volts/mil at 5280 ft of elevation) between the pair of conductors.

When projected on the plane representing the distance between conductors and board thickness, the intersection of the plots for $E_m$ and $E_{\mathit{ref}}$ defines the minimum edge-to-edge distance between conductors for a given board thickness. The minimum distance is denoted as $d_{min}$.

FIGS. 5–7 clearly illustrate that the best structure given a reasonable thickness of the printed circuit board is the structure illustrated in FIG. 4. This structure has the additional advantage of allowing a more uniform and void free solder mask to be placed over and directly around the conductors.

In addition, the equations 2–4 and simulation results can be used to design printed circuit boards utilizing any of the structures for a variety of atmospheric and relative humidity conditions. The use of these equations allows the design of printed circuit boards without requiring latter redesigning to meet regulatory compliance requirements.

Figure 8:
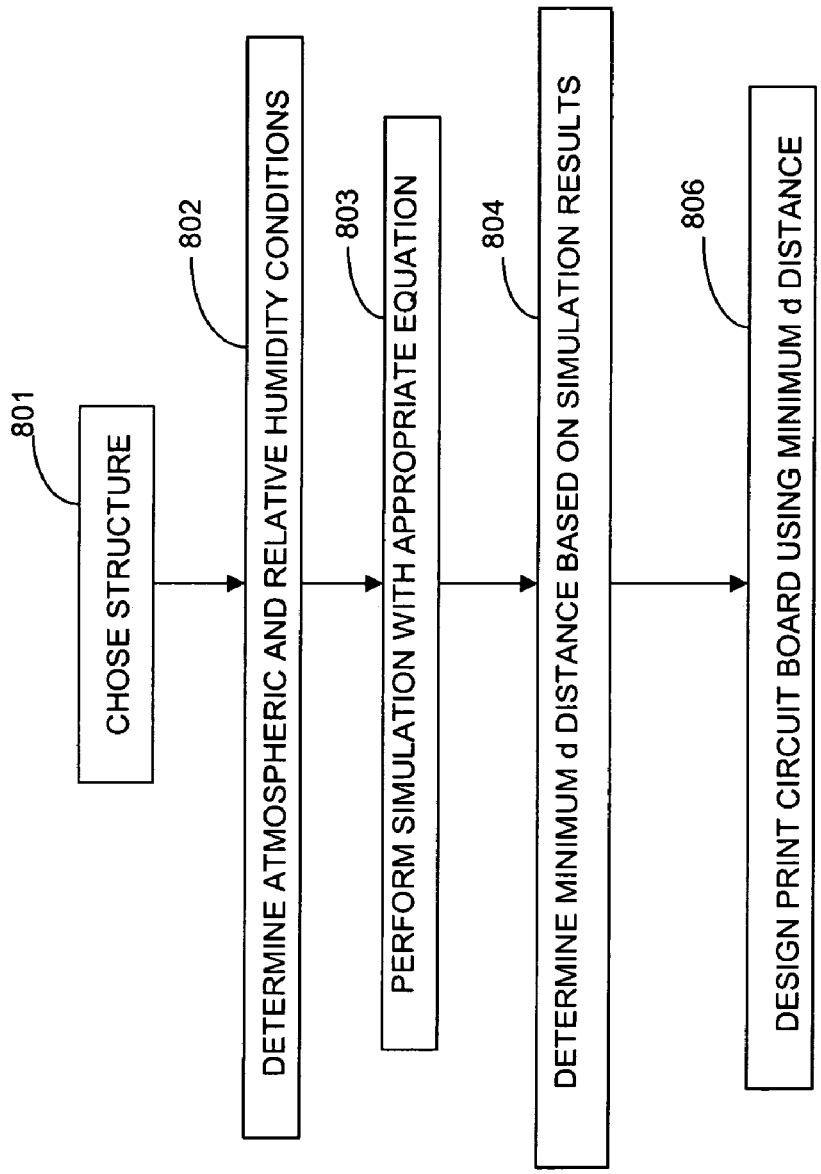
FIG. 8 illustrates, in flowchart form, operations for implementing an embodiment.

FIG. 8 illustrates, in flowchart form, operations performed by an embodiment. In block 801, the structure to be used on the printed circuit board is selected. Then, block 802 selects the desired atmospheric and relative humidity conditions at which the selected board will operate. Block 803 performs the simulation utilizing the equation for the selected structure and the determined atmospheric and relative humidity conditions. The output of block 803 is the simulation results such as those results illustrated in FIGS. 5–7 or any other type of representation known to one skilled in the art. In block 804 the minimum distance between the conductors on the external surfaces of the printed circuit board are determined utilizing the simulation results. Finally, in block 806, the printed circuit board is designed using the minimum distance between the exterior conductors using design techniques well known to those skilled in the art.

Figure 9:
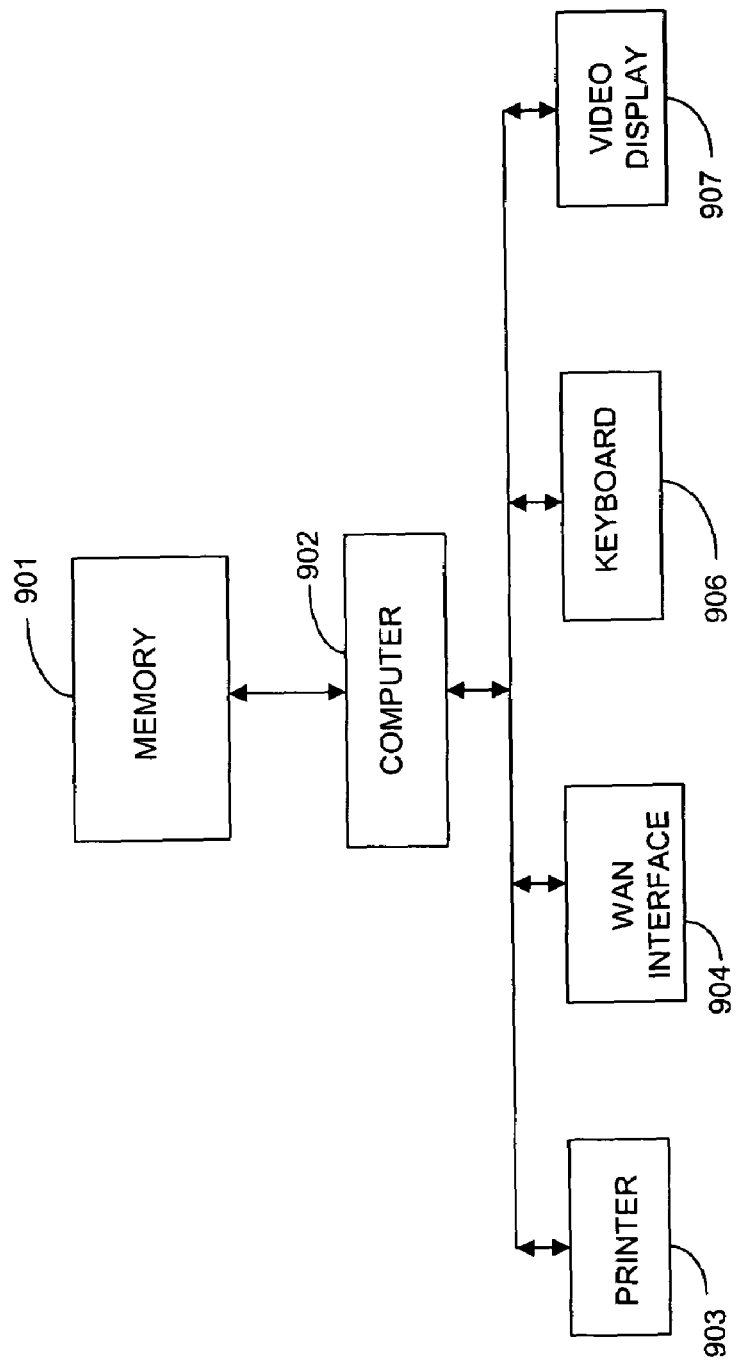
FIG. 9 illustrates, in block diagram form, an embodiment of a computer system.

FIG. 9 illustrates, in block diagram form, an embodiment for implementing the operations described in the embodiment of FIG. 8. Computer 902 controls the operation of devices 903–907 by execution of applications and routines stored in memory 901. The applications utilized to simulate the equations of chosen structures are stored in memory 901. The results of the simulations can be displayed on printer 903 or video display 907. The results can be transmitted to other locations via wide area network (WAN) interface 904. A user enters data such as the desired atmospheric and relative humidity conditions utilizing keyboard 906 or by other input means well known to those skilled in the art.

When the operations of the computers, servers, or systems are implemented in software, it should be noted that the software can be stored on any computer-readable medium for use by or in connection with any computer related system or method. In the context of this document, a computer-readable medium is an electronic, magnetic, optical, or other physical device or means that can contain or store a computer program for use by or in connection with a computer related system or method. The software can be embodied in any computer-readable medium for use by or in connection with an instruction execution system, apparatus, or device such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. For example, the computer-readable medium can be, but is not limited to, an electronic, magnetic, optical, electromagnetic, infrared, or semiconductor system, apparatus, device, or propagation medium.

More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured via optical scanning of the paper or other medium and then compiled, interpreted or otherwise processed in a suitable manner, if necessary, and stored in a computer memory.

In an alternative embodiment, where the computers, servers, or systems is implemented in hardware, the computers, servers, or systems can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Of course, various changes and modifications to the illustrated embodiments described above would be apparent to those skilled in the art. Such changes and modifications can be made without departing from the spirit and scope of the invention and without diminishing its intended advantages. It is therefore intended that such changes and modifications be covered by the following claims except in so far as limited by the prior art.

What is claimed is:

1. A method for designing printed circuit boards to meet current leakage requirement, comprising:
    determining an approximate model of electric fields based on a structure between two conductors on an outer surface of a printed circuit board;
    deriving an effective permittivity of the model of the electric fields;
    calculating a plurality of electric fields using the derived effective permittivity by varying a distance between the two conductors, a thickness of the printed circuit board, and an applied voltage between the two conductors;
    plotting a graph of the calculated plurality of electric fields; and
    selecting a minimum distance between two conductors by using the graph so as to meet the current leakage requirement.

2. The method of claim 1 wherein the structure is a solder mask that substantially covers the outside surface of printed circuit board between the two conductors and the two conductors and the effective permittivity, $\epsilon_{\textit{eff}}$, is equal to:

$$\epsilon_{\textit{eff}} = (1/3) * \{\epsilon_1\epsilon_0 + ([2b/(2b+a)]\epsilon_0 + [a/(2b+a)]\epsilon_2\epsilon_0)\} + 1/3[(d/[2c+d])\epsilon_0 + (2c/[2c+d])\epsilon_2\epsilon_0]$$

where:
    $\epsilon_1$=relative permittivity of the printed circuit board material
    $\epsilon_2$=relative permittivity of the solder mask material
    a=a solder mask portion of a direct electric field path
    b=an air void segment of the direct electric field path
    c=a solder mask segment of an indirect electric field path.

3. The method of claim 1 wherein the structure is a solder mask that covers only the two conductors and the effective permittivity, $\epsilon_{\textit{eff}}$, is equal to:

$$\epsilon_{\textit{eff}} = (1/3) * (\epsilon_1\epsilon_0 + (2c/[2c+d])\epsilon_2\epsilon_0 + d/[2c+d]\epsilon_0) + [2b/(2b+a)]\epsilon_2\epsilon_0 + [a/(2b+a)]\epsilon_0)$$

where:
    $\epsilon_1$=relative permittivity of the print circuit board material
    $\epsilon_2$=relative permittivity of the solder mask material
    a=an air portion of a direct electric field path
    b=a solder mask segment of the direct electric field path
    c=a solder mask segment of an indirect electric field path
    d=an air portion of the indirect electric field path.

4. The method of claim 1 wherein the structure is air between the two conductors and the effective permittivity, $\epsilon_{\textit{eff}}$, is equal to:

$$\epsilon_{\textit{eff}} = (1/3) * (\epsilon_1\epsilon_0 + 2\epsilon_0)$$

where:
    $\epsilon_0$=absolute relative permittivity of air
    $\epsilon_1$=relative permittivity of the printed circuit board material.

5. A processor-readable medium for designing printed circuit boards to meet current leakage requirement, comprising processor-executable instructions configured for:
    determining an approximate model of electric fields based on a structure between two conductors on an outer surface of a printed circuit board;
    deriving an effective permittivity of the model of the electric fields;

calculating a plurality of electric fields using the derived effective permittivity by varying a distance between the two conductors, a thickness of the printed circuit board, and an applied voltage between the two conductors;

plotting a graph of the calculated plurality of electric fields; and selecting a minimum distance between two conductors by using the graph so as to meet the current leakage requirement.

6. The processor-readable medium of claim 5 wherein the structure is a solder mask that substantially covers the outside surface of printed circuit board between the two conductors and the two conductors and the effective permittivity, $\epsilon_{eff}$, is equal to:

$$\epsilon_{eff}=(1/3)*\{\epsilon_1\epsilon_0+([2b/(2b+a)]\epsilon_0+[a/(2b+a)]\epsilon_2\epsilon_0)\}+ 1/3[(d/[2c+d])\epsilon_0+(2c/[2c+d])\epsilon_2\epsilon_0]$$

where:
$\epsilon_1$=relative permittivity of the printed circuit board material
$\epsilon_2$=relative permittivity of the solder mask material
a=a solder mask portion of a direct electric field path
b=an air void segment of the direct electric field path
c=a solder mask segment of an indirect electric field path.

7. The processor-readable medium of claim 5 wherein the structure is a solder mask that covers only the two conductors and the effective permittivity, $\epsilon_{eff}$, is equal to:

$$\epsilon_{eff}=(1/3)*(\epsilon_1\epsilon_0+(2c/[2c+d]\epsilon_2\epsilon_0+d/[2c+d]\epsilon_0)+ [2b/(2b+a)]\epsilon_2\epsilon_0+[a/(2b+a)]\epsilon_0)$$

where:
$\epsilon_1$=relative permittivity of the print circuit board material
$\epsilon_2$=relative permittivity of the solder mask material
a=an air portion of a direct electric field path
b=a solder mask segment of the direct electric field path
c=a solder mask segment of an indirect electric field path
d=an air portion of the indirect electric field path.

8. The processor-readable medium of claim 5 wherein the structure is air between the two conductors and the effective permittivity, $\epsilon_{eff}$, is equal to:

$$\epsilon_{eff}=(1/3)*(\epsilon_1\epsilon_0+2\epsilon_0)$$

where:
$\epsilon_0$=absolute relative permittivity of air
$\epsilon_1$=relative permittivity of the printed circuit board material.

* * * * *